(12) United States Patent
Onuma

(10) Patent No.: US 11,880,634 B2
(45) Date of Patent: Jan. 23, 2024

(54) VOLUME CONTROL SYSTEM, VOLUME CONTROL METHOD, AND NON-TRANSITORY COMPUTER READABLE MEDIUM STORING VOLUME CONTROL PROGRAM

(71) Applicant: TOYOTA JIDOSHA KABUSHIKI KAISHA, Toyota (JP)

(72) Inventor: Yuji Onuma, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 42 days.

(21) Appl. No.: 17/698,488

(22) Filed: Mar. 18, 2022

(65) Prior Publication Data

US 2022/0308827 A1    Sep. 29, 2022

(30) Foreign Application Priority Data

Mar. 23, 2021 (JP) ................................. 2021-049225

(51) Int. Cl.
*G06F 3/16* (2006.01)
*H04R 29/00* (2006.01)
(Continued)

(52) U.S. Cl.
CPC ............. *G06F 3/165* (2013.01); *H04R 1/323* (2013.01); *H04R 1/326* (2013.01); *H04R 3/00* (2013.01);
(Continued)

(58) Field of Classification Search
CPC ...... H04R 9/004; H04R 1/323; H04R 29/004; H04R 1/326; H04R 3/00; H04R 2430/01;
(Continued)

(56) References Cited

U.S. PATENT DOCUMENTS 9,667,284 B1 * 5/2017 Gean ..................... H04W 4/023
2002/0183101 A1 * 12/2002 Oh ....................... H04M 1/6075
455/557

(Continued)

FOREIGN PATENT DOCUMENTS

CN      110399114 A  * 11/2019  ............. G01S 19/14
CN      212211296 U  * 12/2020
(Continued)

*Primary Examiner* — Carolyn R Edwards
*Assistant Examiner* — Kuassi A Ganmavo
(74) *Attorney, Agent, or Firm* — Dinsmore & Shohl LLP

(57) ABSTRACT

An operation terminal is configured to: determine whether or not a directional microphone and/or a directional speaker of a mobile object is facing toward the operation terminal based on the position and the orientation of the mobile object, a sound picking-up angle of the directional microphone of the mobile object and an output angle of the directional speaker thereof, and the position of the operation terminal; set, when the directional microphone and/or the directional speaker of the mobile object is facing toward the operation terminal, a predetermined threshold as a distance threshold, and determines whether or not a distance between the mobile object and the operation terminal is equal to or shorter than the predetermined threshold; and make, when the distance is equal to or shorter than the predetermined threshold, at least one of the mobile object and the operation terminal reduce the volume of its microphone and/or speaker.

21 Claims, 7 Drawing Sheets

(51) Int. Cl.
*H04R 1/32* (2006.01)
*H04R 3/00* (2006.01)
*H04B 1/036* (2006.01)
*H04M 1/02* (2006.01)
*H04R 3/02* (2006.01)
*H05K 7/20* (2006.01)
*H04M 3/56* (2006.01)
*H04M 1/03* (2006.01)

(52) U.S. Cl.
CPC ......... *H04R 29/001* (2013.01); *H04R 29/004* (2013.01); *H04B 1/036* (2013.01); *H04M 1/02* (2013.01); *H04M 1/035* (2013.01); *H04M 3/56* (2013.01); *H04R 3/02* (2013.01); *H04R 2430/01* (2013.01); *H05K 7/20336* (2013.01)

(58) Field of Classification Search
CPC ........... H04R 3/02; G06F 3/165; H04B 1/036; H04M 1/02; H04M 3/56; H04M 1/035; H05K 7/20336
See application file for complete search history.

(56) References Cited

U.S. PATENT DOCUMENTS

| | | | |
|---|---|---|---|
| 2005/0041839 A1* | 2/2005 | Saitou | H04N 1/00244 382/103 |
| 2007/0019816 A1* | 1/2007 | Konagai | H04R 3/12 381/59 |
| 2013/0010984 A1* | 1/2013 | Hejnicki | H04R 27/00 381/107 |

FOREIGN PATENT DOCUMENTS

| | | | | |
|---|---|---|---|---|
| JP | 2006109340 A | * | 4/2006 | |
| JP | 4149456 B2 | | 9/2008 | |
| JP | 5151941 B2 | | 2/2013 | |
| JP | 2014175979 A | * | 9/2014 | |
| JP | 5890289 B2 | | 3/2016 | |
| JP | 2017126826 A | * | 7/2017 | |
| WO | WO-2019119434 A1 | * | 6/2019 | .......... G05D 1/0808 |

* cited by examiner

| MOBILE OBJECT ID | SOUND COLLECTING ANGLE (°) | OUTPUT ANGLE (°) | FIRST THRESHOLD (m) | SECOND THRESHOLD (m) |
|---|---|---|---|---|
| MO1 | 45 | 50 | 10 | 5 |
| MO2 | 40 | 45 | 12 | 6 |
| MO3 | 50 | 55 | 8 | 4 |
| MO4 | 47 | 52 | 9 | 5 |
| MO5 | 35 | 40 | 14 | 7 |
| ⋮ | | | ⋮ | ⋮ |

VOLUME CONTROL SYSTEM, VOLUME CONTROL METHOD, AND NON-TRANSITORY COMPUTER READABLE MEDIUM STORING VOLUME CONTROL PROGRAM

CROSS REFERENCE TO RELATED APPLICATIONS

This application is based upon and claims the benefit of priority from Japanese patent application No. 2021-49225, filed on Mar. 23, 2021, the disclosure of which is incorporated herein in its entirety by reference.

BACKGROUND

The present disclosure relates to a volume control system, a volume control method, and a non-transitory computer readable medium storing a volume control program for controlling a volume.

Remotely controlling mobile objects such as telepresence robots and drones by using control terminals has been conducted in the past. Some of such control terminals and mobile objects are equipped with both a microphone and a speaker, or either one of them.

When such a mobile object moves closer to such an operation terminal, a sound output from the speaker of the mobile object is picked up by the microphone of the operation terminal. Then, the picked-up sound is transmitted to the mobile object and output again from the speaker of the mobile object, so that a loop of the sound is formed. Similarly, a sound output from the speaker of the operation terminal is picked up by the microphone of the mobile object, and the picked-up sound is transmitted to the operation terminal and output again from the speaker of the operation terminal, so that a loop of the sound is formed. Because of such sound loops, a howling noise (i.e., feedback) occurs between the mobile object and the operation terminal.

In this regard, in a voice control method disclosed in Japanese Patent No. 5890289, a portable terminal detects (i.e., measures) a distance between that portable terminal and another portable terminal, and when the detected distance is shorter than a predetermined distance and the other portable terminal is in a muted state (i.e., in a volume-reduced state), the portable terminal mutes (i.e., reduces the volume (i.e., the sensitivity) of) its own microphone.

SUMMARY

However, in the voice control method disclosed in Japanese Patent No. 5890289, the orientation of the portable terminal is not taken into consideration, so there is a problem that it is impossible to control the volume of the portable terminal according to the orientation thereof.

The present disclosure has been made in order to solve the above-described problem, and an object thereof is to provide a volume control system, a volume control method, and a volume control program capable of preventing a howling noise from occurring.

A first exemplary aspect is a volume control system including:

a mobile object including at least one of a directional microphone and a directional speaker; and an operation terminal including at least one of a microphone and a speaker, and configured to control the mobile object, in which the volume control system is configured to:

determine whether or not at least one of the directional microphone and the directional speaker of the mobile object is facing toward the operation terminal based on a position of the mobile object, an orientation of the mobile object, at least one of a sound picking-up angle of the directional microphone of the mobile object and an output angle of the directional speaker thereof, and a position of the operation terminal;

set, when at least one of the directional microphone and the directional speaker of the mobile object is facing toward the operation terminal, a predetermined threshold as a distance threshold;

determine whether or not a distance between the mobile object and the operation terminal is equal to or shorter than the predetermined threshold based on the position of the mobile object and the position of the operation terminal; and make, when the distance is equal to or shorter than the predetermined threshold, at least one of the mobile object and the operation terminal reduce at least one of a volume (i.e., a sensitivity) of its microphone and a volume of its speaker.

The predetermined threshold may be a first threshold, and the volume control system may further be configured to set, when neither the directional microphone of the mobile object nor the directional speaker thereof is facing toward the operation terminal, a second threshold smaller than the first threshold as the distance threshold.

The volume control system may further be configured to:

determine whether or not at least one of the directional microphone and the directional speaker of the operation terminal is facing toward the mobile object based on a position of the operation terminal, an orientation of the operation terminal, at least one of a sound picking-up angle of the directional microphone of the operation terminal and an output angle of the directional speaker thereof, and a position of the mobile object; and set, when at least one of the directional microphone and the directional speaker of the operation terminal is facing toward the mobile object, a third threshold as the distance threshold.

The volume control system may further be configured to set, when neither the directional microphone of the operation terminal nor the directional speaker thereof is facing toward the mobile object, a fourth threshold smaller than the third threshold as the distance threshold.

The distance threshold may be a value having a positive correlation with a directivity of the directional microphone and the directional speaker.

The distance threshold may be a value having a positive correlation with a sensitivity of the directional microphone.

The distance threshold may be a value having a positive correlation with a volume of the speaker.

Another exemplary aspect is a volume control method for controlling at least one of a volume of a mobile object and a volume of an operation terminal, the mobile object including at least one of a directional microphone and a directional speaker, the operation terminal including at least one of a microphone and a speaker, and configured to control the mobile object, and the volume control method including:

determining, by a computer, whether or not at least one of the directional microphone and the directional speaker of the mobile object is facing toward the operation terminal based on a position of the mobile object, an orientation of the mobile object, at least one of a sound picking-up angle of the directional microphone of the mobile object and an output angle of the directional speaker thereof, and a position of the operation terminal;

setting, by the computer, when at least one of the directional microphone and the directional speaker of the mobile object is facing toward the operation terminal, a predetermined threshold as a distance threshold;

determining, by the computer, whether or not a distance between the mobile object and the operation terminal is equal to or shorter than the predetermined threshold based on the position of the mobile object and the position of the operation terminal; and making, by the computer, when the distance is equal to or shorter than the predetermined threshold, at least one of the mobile object and the operation terminal reduce at least one of a volume of its microphone and a volume of its speaker.

Another exemplary aspect is a volume control program stored in a non-transitory computer readable medium for a computer configured to control at least one of a volume of a mobile object and a volume of an operation terminal, the mobile object including at least one of a directional microphone and a directional speaker, the operation terminal including at least one of a microphone and a speaker, and configured to control the mobile object, and the volume control program being adapted for causing the computer to perform:

determine, by a computer, whether or not at least one of the directional microphone and the directional speaker of the mobile object is facing toward the operation terminal based on a position of the mobile object, an orientation of the mobile object, at least one of a sound picking-up angle of the directional microphone of the mobile object and an output angle of the directional speaker thereof, and a position of the operation terminal;

set, by the computer, when at least one of the directional microphone and the directional speaker of the mobile object is facing toward the operation terminal, a predetermined threshold as a distance threshold;

determine, by the computer, whether or not a distance between the mobile object and the operation terminal is equal to or shorter than the predetermined threshold based on the position of the mobile object and the position of the operation terminal; and make, by the computer, when the distance is equal to or shorter than the predetermined threshold, at least one of the mobile object and the operation terminal reduce at least one of a volume of its microphone and a volume of its speaker.

According to the present disclosure, it is possible to provide a volume control system, a volume control method, and a non-transitory computer readable medium storing a volume control program capable of preventing a howling noise from occurring.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF DRAWINGS

FIG. 5 shows an example of a mobile-object information table according to an embodiment of the present disclosure;

DESCRIPTION OF EMBODIMENTS

Figure 1:
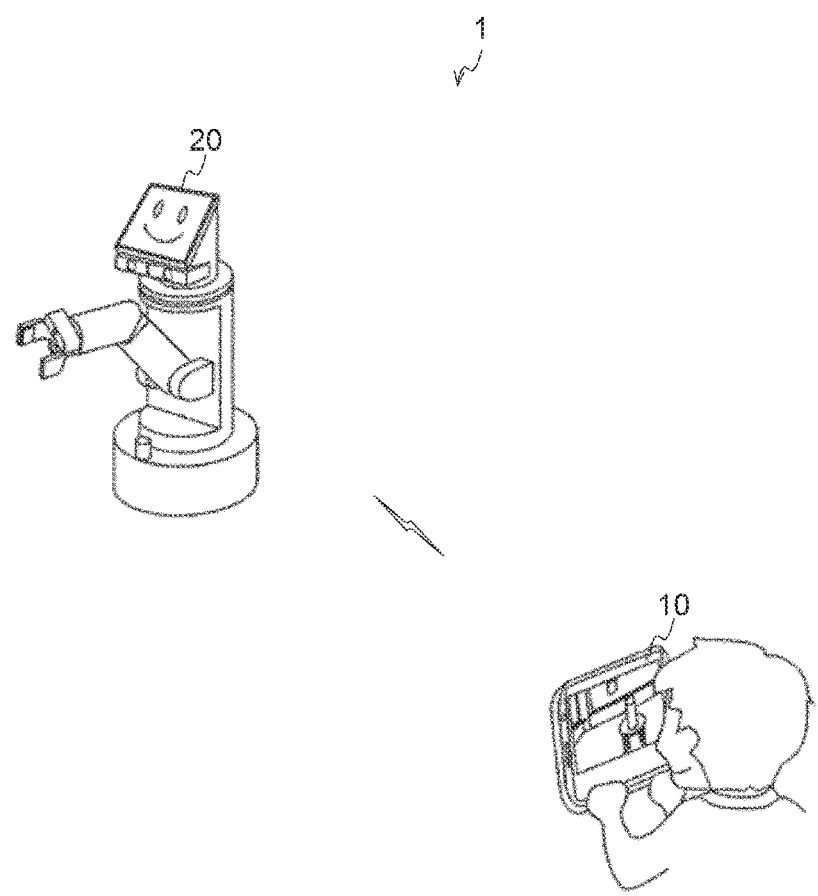
FIG. 1 shows an example of a volume control system according to an embodiment of the present disclosure.

An embodiment according to the present disclosure will be described hereinafter with reference to the drawings. FIG. 1 shows an example of a volume control system according to an embodiment of the present disclosure. The volume control system 1 includes an operation terminal 10 and a mobile object 20. The operation terminal 10 and the mobile object 20 can transmit/receive data to/from each other through radio communication in conformity to one of various radio communication standards. Note that although only one mobile object 20 is shown in FIG. 1, the number of mobile objects 20 that can be included in the volume control system 1 is not limited to one.

The mobile object 20 is an apparatus that operates according to the control of the operation terminal 10. Specific examples of the mobile object 20 include robots such as telepresence robots having voice conversation functions and flying objects such as drones. FIG. 1 shows a telepresence robot which is an example of the mobile object 20.

The mobile object 20 periodically transmits its identification information, position information, and orientation information to the operation terminal 10. The position information indicates the current position of the mobile object 20. The orientation information is information indicating the current orientation of the mobile object 20 (i.e., the direction in which the mobile object 20 is currently facing). In this embodiment, the operation terminal 10 determines whether or not at least one of a directional microphone and a directional speaker of the mobile object 20 is facing toward the operation terminal 10 by using the position information and the orientation information of the mobile object 20, at least one of a sound picking-up angle of the directional microphone of the mobile object 20 and an output angle of the directional speaker thereof, and the position information of the operation terminal 10. The sound picking-up angle is an angle that defines a range in which the directional microphone can pick up sounds. The output angle is an angle that defines a range in which the directional speaker can output sounds. The operation terminal 10 controls at least one of the volume (i.e., the sensitivity) of the directional microphone 210 of the mobile object 20 and the volume of the directional speaker 220 thereof according to the result of the above-described determination.

Figure 2:
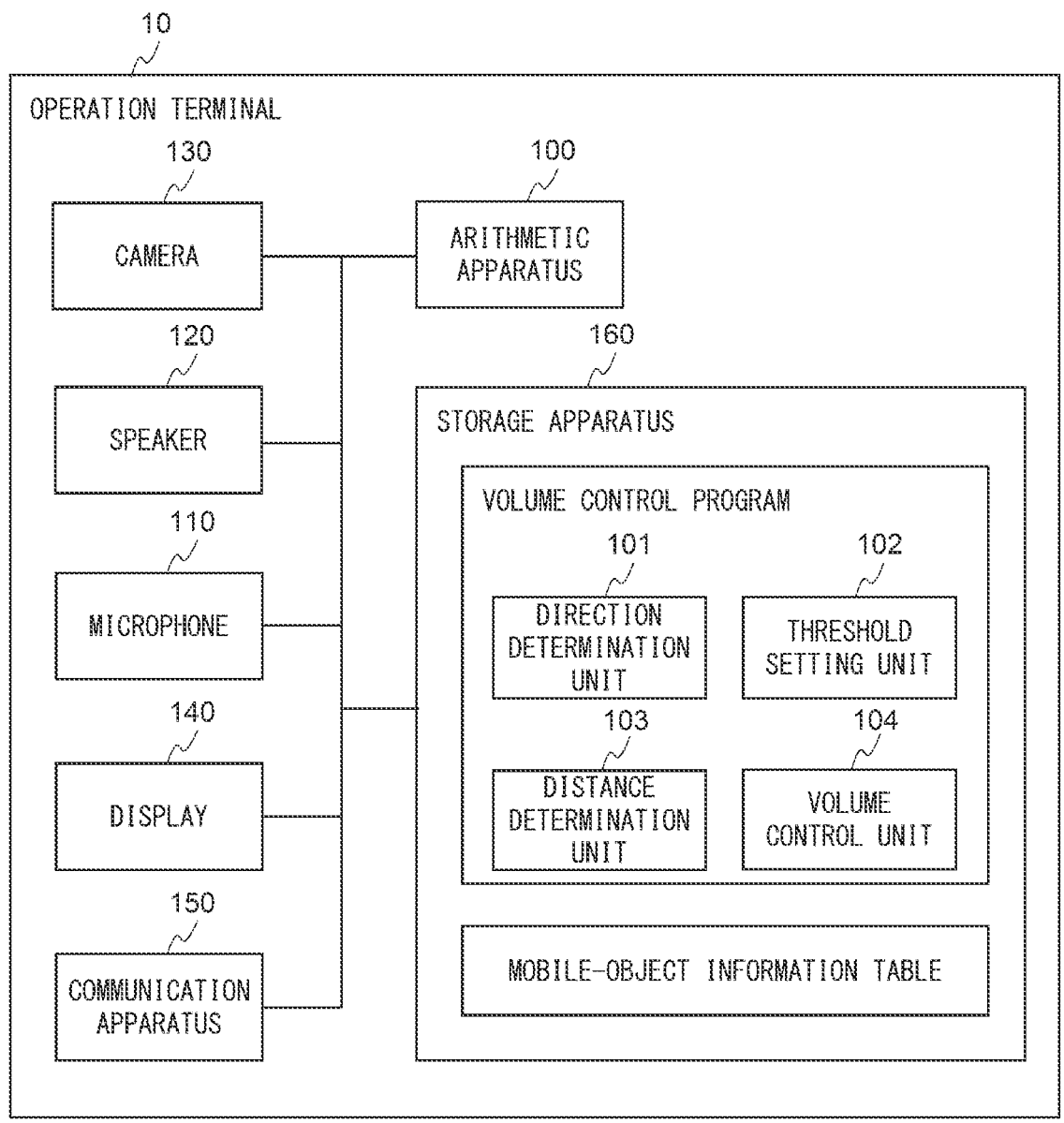
FIG. 2 is a block diagram showing a configuration of an operation terminal according to an embodiment of the present disclosure.

FIG. 2 is a block diagram showing a configuration of the operation terminal 10 according to an embodiment of the present disclosure. The operation terminal 10 is an information processing apparatus that controls the mobile object 20. The operation terminal 10 includes an arithmetic apparatus 100, a microphone 110, a speaker 120, a camera 130, a display 140, a communication apparatus 150, and a storage apparatus 160.

The arithmetic apparatus 100 is an arithmetic apparatus, such as a CPU (Central Processing Unit) or an MPU (Micro Processing Unit), that controls an electronic circuit(s) and/or an electronic apparatus(es) included in the operation terminal 10. The arithmetic apparatus 100 can perform a volume control method by loading a volume control program from the storage apparatus 160 and executing the loaded volume control program. The volume control program includes an orientation determination unit 101, a threshold setting unit 102, a distance determination unit 103, and a volume control unit 104.

The orientation determination unit 101 is a program for determining whether or not at least one of the directional microphone 210 and the directional speaker 220 of the mobile object 20 is facing toward the operation terminal 10 by using the position information and the orientation information of the mobile object 20, at least one of the sound picking-up angle of the directional microphone 210 of the mobile object 20 and the output angle of the directional speaker 220 thereof, and the position information of the operation terminal 10.

Figure 4:
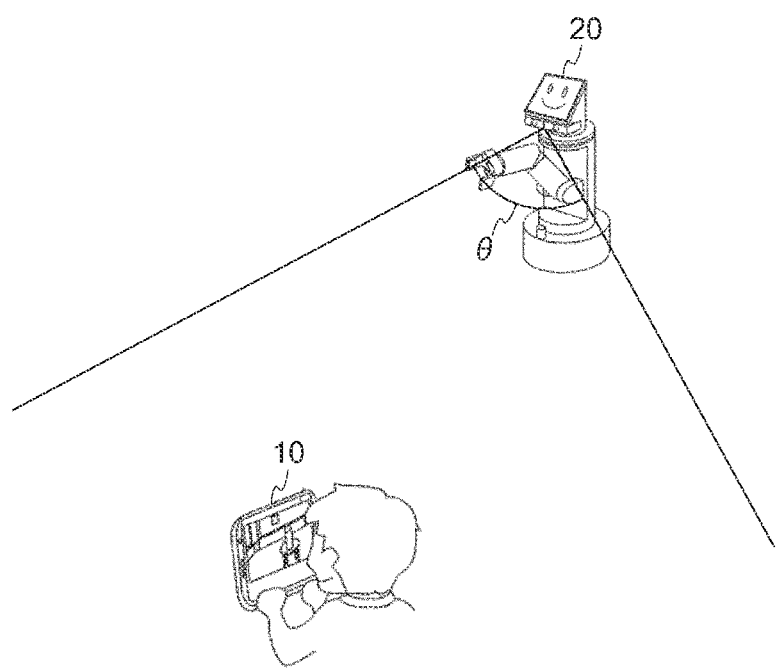
FIG. 4 is a conceptual diagram showing a process for determining whether or not a directional microphone of a mobile object is facing toward an operation terminal.

FIG. 4 is a conceptual diagram showing a process for determining whether or not the directional microphone of the mobile object 20 is facing toward the operation terminal 10. The orientation determination unit 101 specifies the position of the mobile object 20 and the position of the operation terminal 10 by using the position information of the mobile object 20 and the position information of the operation terminal 10. The position information of the operation terminal 10 can be set in advance by an operator.

Next, the orientation determination unit 101 refers to a mobile-object information table (FIG. 5) in which information about the mobile object 20 is registered, and acquires the sound picking-up angle θ of the directional microphone of the target mobile object. The orientation determination unit 101 specifies a sound picking-up range of the directional microphone of the mobile object 20 based on the position information, the orientation information, and the sound picking-up angle of the mobile object 20. Then, the orientation determination unit 101 can determine whether or not the directional microphone of the mobile object 20 is facing toward the operation terminal 10 by determining whether or not the position of the operation terminal 10 is included in the sound picking-up range of the mobile object 20.

The same applies to the process for determining whether or not the directional speaker of the mobile object 20 is facing toward the operation terminal 10. Specifically, the orientation determination unit 101 refers to the mobile-object information table and acquires the output angle of the directional speaker of the target mobile object. The orientation determination unit 101 specifies an output range of the directional speaker of the mobile object 20 based on the position information, the orientation information, and the output angle of the mobile object 20. Then, the orientation determination unit 101 can determine whether or not the directional speaker of the mobile object 20 is facing toward the operation terminal 10 by determining whether or not the position of the operation terminal 10 is included in the output range of the mobile object 20.

The threshold setting unit 102 is a program for setting a predetermined threshold as a distance threshold according to the result of the determination by the orientation determination unit 101. Specifically, the threshold setting unit 102 sets a first threshold as the distance threshold when at least one of the directional microphone 210 and the directional speaker 220 of the mobile object 20 is facing toward the operation terminal 10. The first threshold can be a distance at which a howling noise could occur between the operation terminal 10 and the mobile object 20 when at least one of the directional microphone 210 and the directional speaker 220 of the mobile object 20 is facing toward the operation terminal 10.

On the other hand, when neither the directional microphone 210 of the mobile object 20 nor the directional speaker 220 thereof is facing toward the operation terminal 10, the threshold setting unit 102 sets a second threshold as the distance threshold. The second threshold is a smaller than the first threshold, and can be a distance at which a howling noise could occur between the operation terminal 10 and the mobile object 20 when neither the directional microphone 210 of the mobile object 20 nor the directional speaker 220 thereof is facing toward the operation terminal 10.

FIG. 5 shows an example of the mobile-object information table. In the mobile-object information table, the identification information of the operation terminal 10, the sound picking-up angle of the directional microphone 110 of the operation terminal 10, the output angle of the directional speaker of the operation terminal 10, and the first and second thresholds of the operation terminal 10 are registered while they are associated with one another. The threshold setting unit 102 can set the distance threshold for each operation terminal 10 by referring to the above-described mobile-object information table.

In this embodiment, it is possible to adopt a value having a positive correlation with the directivity of the directional microphone 210 and the directional speaker 220 of the mobile object 20 as the distance threshold. Specifically, when the directivity of the microphone 210 of the mobile object 20 is high, the sound picking-up angle becomes smaller and the sound picking-up distance, within which the microphone 210 can pick up sounds, becomes longer, so that a large value can be adopted as the distance threshold. On the other hand, when the directivity of the microphone 210 of the mobile object 20 is low, the sound picking-up angle becomes larger and the sound picking-up distance becomes shorter, so that a small value can be adopted as the distance threshold.

Similarly, when the directivity of the speaker 220 of the mobile object 20 is high, i.e., when the output angle of the speaker 220 is small, the propagation distance of a sound output from the speaker 220 becomes longer, so that a large value can be adopted as the distance threshold. On the other hand, when the directivity of the speaker 220 of the mobile object 20 is low, i.e., when the output angle of the speaker 220 is large, the propagation distance becomes shorter, so that a small value can be adopted as the distance threshold.

Further, in this embodiment, it is possible to adopt a value having a positive correlation with the sensitivity of the microphone 210 of the mobile object 20 can be adopted as the distance threshold. Specifically, when the sensitivity of the microphone 210 of the mobile object 20 is high, the sound picking-up distance becomes longer, so that a large value can be adopted as the distance threshold. On the other hand, when the sensitivity of the microphone 210 of the mobile object 20 is low, the sound picking-up distance becomes shorter, so that a small value can be adopted as the distance threshold.

Further, in this embodiment, it is possible to adopt a value having a positive correlation with the volume of the speaker 220 of the mobile object 20 as the distance threshold. Specifically, when the volume of the speaker 220 of the mobile object 20 is large, the propagation distance becomes longer, so that a large value can be adopted as the distance threshold. On the other hand, when the volume of the speaker 220 of the mobile object 20 is small, the propagation distance becomes shorter, so that a small value can be adopted as the distance threshold.

The distance determination unit 103 is a program for calculating the distance between the mobile object 20 and the operation terminal 10 based on the position of the mobile object 20 and the position of the operation terminal 10, and determining whether the calculated distance is longer or shorter than the distance threshold.

The volume control unit 104 is a program for controlling at least at least one of the volume (i.e., the sensitivity) of the microphone 210 of the mobile object 20 and the volume of the speaker 220 thereof according to the result of the determination by the distance determination unit 103.

The microphone 110 is a sound picking-up apparatus that acquires sounds around the operation terminal 10. The microphone 110 is, for example, an omni-directional microphone or a directional microphone. The sounds acquired by the microphone 110 could include sounds output by the speaker of the mobile object 20.

The speaker 120 is an apparatus that outputs various sounds. The sounds output by the speaker 120 could include sounds that are output by the speaker 120 of the operation terminal 10 and picked up by the microphone of the mobile object 20.

The camera 130 is a photographing apparatus that mainly photographs objects around the operation terminal 10. The display 140 is an apparatus that displays arbitrary images supplied from the arithmetic apparatus 100.

The communication apparatus 150 is an apparatus that transmits/receives data to/from the mobile object 20. When the communication apparatus 150 receives various data from the mobile object 20, it supplies these data to the arithmetic apparatus 100. Further, the communication apparatus 150 can also transmit various data to the mobile object 20 under the control of the arithmetic apparatus 100.

The storage apparatus 160 is a storage apparatus in which various data such as the volume control program and the mobile-object information table are stored.

Figure 3:
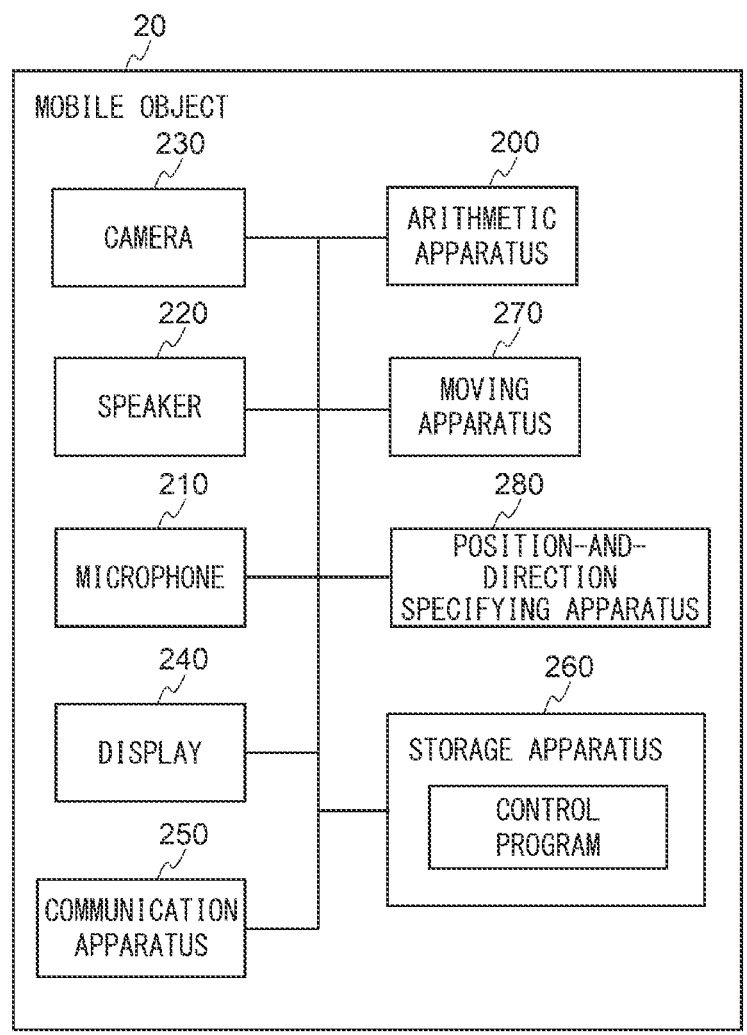
FIG. 3 is a block diagram showing a configuration of a mobile object according to an embodiment of the present disclosure.

FIG. 3 shows a block diagram of a mobile object 20 according to an embodiment of the present disclosure. The mobile object 20 includes an arithmetic apparatus 200, a microphone 210, a speaker 220, a camera 230, a display 240, a communication apparatus 250, a storage apparatus 260, a moving apparatus 270, and a position-and-orientation specifying apparatus 280.

The arithmetic apparatus 200 is an arithmetic apparatus, such as a CPU or an MPU, that controls an electronic circuit(s) and/or an electronic apparatus(es) included in the mobile object 20. The arithmetic apparatus 200 loads a control program from the storage apparatus 260 and executes the loaded control program. The control program is a program for controlling sounds of the microphone 210 and the speaker 220 based on instructions from the operation terminal 10.

The microphone 210 is a sound picking-up apparatus that acquires sounds around the mobile object 20. The microphone 210 is a directional microphone having a predetermined sound picking-up angle and a predetermined sound picking-up distance. The sounds acquired by the microphone 210 could include sounds output by the speaker 120 of the operation terminal 10.

The speaker 220 is an apparatus that outputs various sounds. The sounds output by the speaker 220 could include sounds that are output by the speaker 220 of the mobile object 20 and picked up by the microphone 110 of the operation terminal 10.

The camera 230 is a photographing apparatus that mainly photographs objects around the operation terminal 10. The display 240 is an apparatus that displays arbitrary images supplied from the arithmetic apparatus 200.

The communication apparatus 250 is an apparatus that transmits/receives data to/from the operation terminal 10. When the communication apparatus 250 receives various data from the operation terminal 10, it supplies these data to the arithmetic apparatus 200. Further, the communication apparatus 250 can transmit various data to the operation terminal 10 under the control of the arithmetic apparatus 200.

The storage apparatus 260 is a storage apparatus in which various data such as the control program are stored.

The moving apparatus 270 is an apparatus for moving the mobile object 20. Specifically, when the mobile object 20 is a telepresence robot, the moving apparatus 270 is, for example, a cart on which the telepresence robot is mounted, and enables the telepresence robot to travel. When the mobile object 20 is a flying object such as a drone, the moving apparatus 270 is, for example, a propeller that enables the flying object to fly.

The position-and-orientation specifying apparatus 280 is an apparatus that specifies the position and the orientation of the mobile object 20. For example, when the mobile object 20 is a telepresence robot, the position-and-orientation specifying apparatus 280 can specify the position and the orientation of the mobile object 20 by using SLAM (Simultaneous Localization and Mapping).

When the mobile object 20 is a drone, the position-and-orientation specifying apparatus 280 can specify the position of the mobile object 20 by using positioning signals supplied from a GNSS (Global Navigation Satellite System) such as a GPS (Global Positioning System). Further, the position-and-orientation specifying apparatus 280 can specify the orientation of the mobile object 20 (i.e., the direction in which the mobile object 20 is facing) based on the geomagnetic field acquired by using a geomagnetic sensor.

Figure 6:
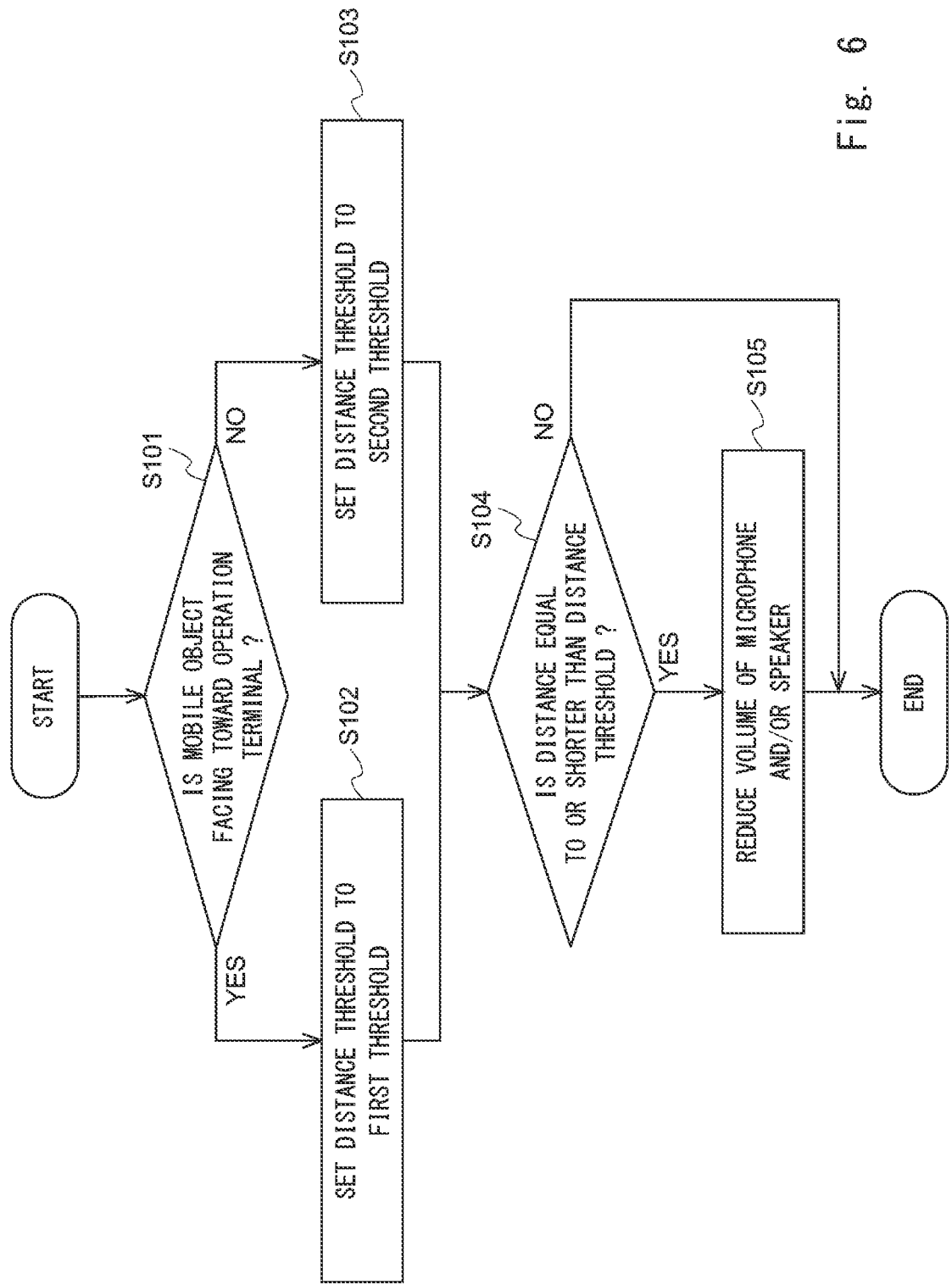
FIG. 6 is a flowchart showing an example of processes performed by an operation terminal according to an embodiment of the present disclosure.

FIG. 6 is a flowchart showing an example of processes performed by the operation terminal 10. In a step S101, the orientation determination unit 101 of the operation terminal 10 determines whether or not at least one of the directional microphone 210 and the directional speaker 220 of the mobile object 20 is facing toward the operation terminal 10 based on the position information and the orientation information of the mobile object 20, at least one of the sound picking-up angle of the directional microphone 210 of the mobile object 20 and the output angle of the directional speaker 220 thereof, and the position information of the operation terminal 10.

When at least one of the directional microphone 210 and the directional speaker 220 of the mobile object 20 is facing toward the operation terminal 10 (Yes), the threshold setting unit 102 sets the distance threshold to the first threshold in a step S102. On the other hand, when neither the directional microphone 210 of the mobile object 20 nor the directional speaker 220 thereof is facing toward the operation terminal 10 (No), the threshold setting unit 102 sets the distance threshold to the second threshold in a step S103.

In a step S104, the distance determination unit 103 calculates the distance between the mobile object 20 and the operation terminal 10 based on the position information of the operation terminal 10 and the position information of the mobile object 20, and determines whether or not the calculated distance is equal to or shorter than the distance threshold. When the distance between the mobile object 20 and the operation terminal 10 is longer than the distance threshold (No), the processes shown in FIG. 6 are finished. On the other hand, when the distance between the mobile object 20 and the operation terminal 10 is equal to or shorter than the distance threshold (Yes), the volume control unit 104 reduces at least one of the volume (i.e., the sensitivity) of the microphone 210 of the mobile object 20 and the volume of the speaker 220 thereof in a step S105, and the processes shown in FIG. 6 are finished.

Figure 7:
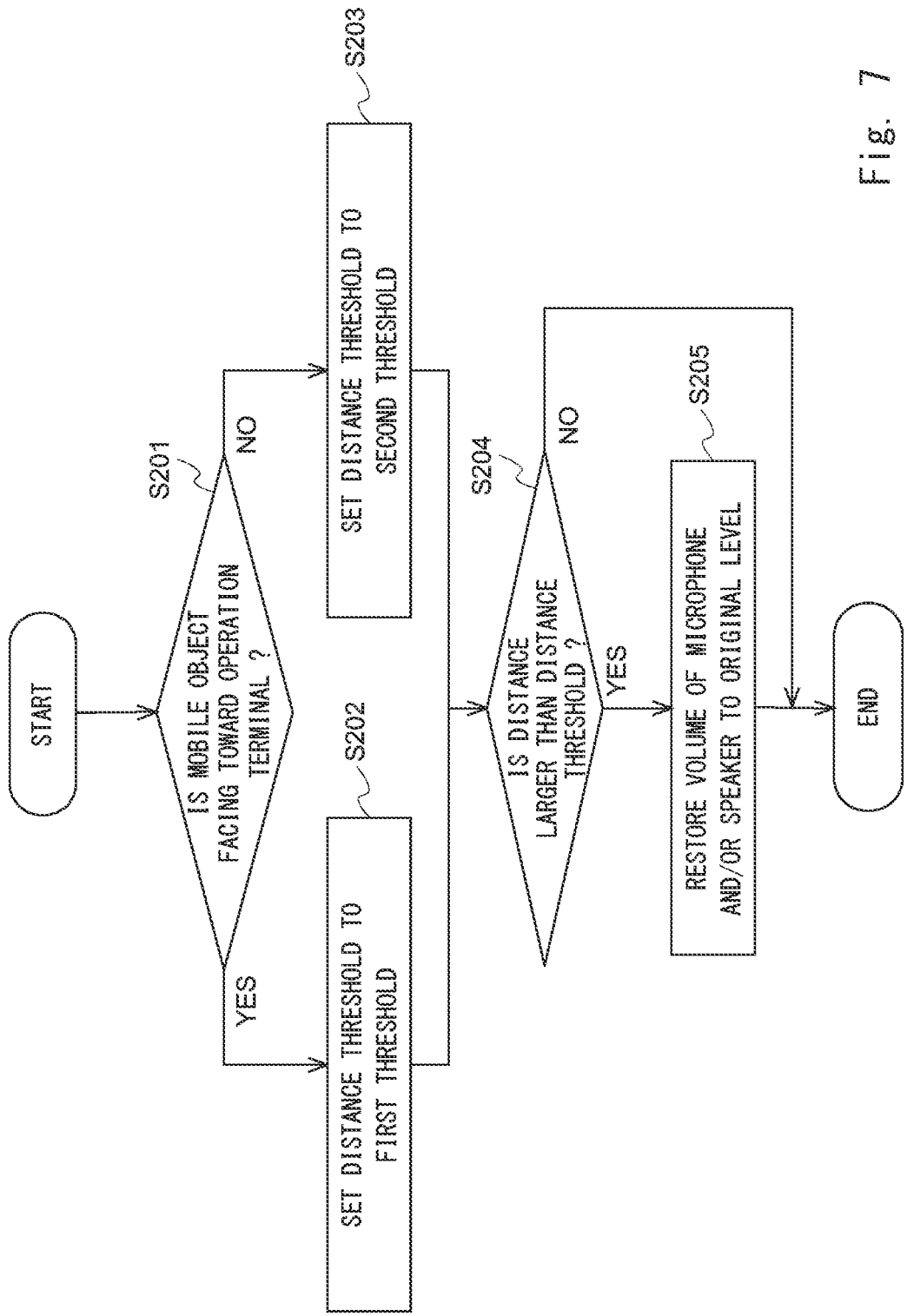
FIG. 7 is a flowchart showing another example of processes performed by an operation terminal according to an embodiment of the present disclosure.

FIG. 7 is a flowchart showing another example of processes performed by the operation terminal 10. The processes shown in FIG. 7 are performed when at least one of the volume (i.e., the sensitivity) of the microphone 210 of the mobile object 20 and the volume of the speaker 220 thereof is reduced.

In a step S201, the orientation determination unit 101 of the operation terminal 10 determines whether or not at least one of the directional microphone 210 and the directional speaker 220 of the mobile object 20 is facing toward the operation terminal 10 based on the position information and the orientation information of the mobile object 20, at least one of the sound picking-up angle of the directional microphone 210 of the mobile object 20 and the output angle of the directional speaker 220 thereof, and the position information of the operation terminal 10.

When at least one of the directional microphone 210 and the directional speaker 220 of the mobile object 20 is facing toward the operation terminal 10 (Yes), the threshold setting unit 102 sets the distance threshold to the first threshold in a step S202. On the other hand, when neither the directional microphone 210 of the mobile object 20 nor the directional speaker 220 thereof is facing toward the operation terminal 10 (No), the threshold setting unit 102 sets the distance threshold to the second threshold in a step S203.

In a step S204, the distance determination unit 103 calculates the distance between the mobile object 20 and the operation terminal 10 based on the position information of the operation terminal 10 and the position information of the mobile object 20, and determines whether or not the calculated distance is longer than the distance threshold. When the distance between the mobile object 20 and the operation terminal 10 is equal to or shorter than the distance threshold (No), the processes shown in FIG. 7 are finished. On the other hand, when the distance between the mobile object 20 and the operation terminal 10 is longer than the distance threshold (Yes), the volume control unit 104 restores the volume (i.e., the sensitivity) of the microphone 210 of the mobile object 20 and the volume of the speaker 220 thereof to the original levels at a step S205, and the processes shown in FIG. 7 are finished.

In the above-described embodiment, the orientation determination unit 101 determines whether or not at least one of the microphone 210 and the speaker 220 of the mobile object 20 is facing toward the operation terminal 10 based on the position of the mobile object 20, the orientation of the mobile object 20, at least one of the sound picking-up angle of the microphone 210 of the mobile object 20 and the output angle of the speaker 220 thereof, and the position of the operation terminal 10. When at least one of the directional microphone 210 and the directional speaker 220 of the mobile object 20 is facing toward the operation terminal 10, the threshold setting unit 102 sets the first threshold as the distance threshold. The first threshold can be a distance at which a howling noise could occur between the operation terminal 10 and the mobile object 20 when at least one of the directional microphone 210 and the directional speaker 220 of the mobile object 20 is facing toward the operation terminal 10.

Next, the distance determination unit 103 calculates the distance between the mobile object 20 and the operation terminal 10 based on the position of the mobile object 20 and the position of the operation terminal 10, and determines whether or not the calculated distance is equal to or shorter than the first threshold. When this distance is equal to or shorter than the predetermined threshold, the volume control unit 104 makes the mobile object 20 reduce at least one of the volume (i.e., the sensitivity) of the microphone 210 and the volume of the speaker 220.

In this way, it is possible to reduce at least one of the volume (i.e., the sensitivity) of the microphone 210 of the mobile object 20 and the volume of the speaker 220 thereof when the mobile object 20 has approached (i.e., moved closer to) the operation terminal 10, i.e., moved within a distance from the operation terminal 10 at which a howling noise could occur between the operation terminal 10 and the mobile object 20. Therefore, it is possible to prevent a howling noise from occurring due to the approach of the mobile object 20 to the operation terminal 10.

Further, in the above-described embodiment, when neither the directional microphone 210 of the mobile object 20 nor the directional speaker 220 thereof is facing toward the operation terminal 10, the threshold setting unit 102 sets the second threshold smaller than the first threshold as the distance threshold. The second threshold can be a distance at which a howling noise could occur between the operation terminal 10 and the mobile object 20 when neither the directional microphone 210 of the mobile object 20 nor the directional speaker 220 thereof is facing toward the operation terminal 10.

In this way, when neither the directional microphone 210 of the mobile object 20 nor the directional speaker 220 thereof is facing toward the operation terminal 10, e.g., when both the directional microphone 210 and the directional speaker 220 of the mobile object 20 are facing in the opposite direction with respect to the operation terminal 10, neither the volume (i.e., the sensitivity) of the microphone 210 of the mobile object 20 nor the volume of the speaker 220 thereof is reduced even when the mobile object 20 is located at a distance from the operation terminal 10 that is longer than the second threshold and is shorter than the first threshold. Therefore, it is possible to prevent, for example, the microphone and/or the speaker from being unnecessary muted (i.e., to prevent their sensitivity and volume from being unnecessary reduced).

Further, in the above-described embodiment, it is possible to adopt a value having a positive correlation with the directivity of the directional microphone 210 and the directional speaker 220 of the mobile object 20 as the distance threshold. Specifically, when the directivity of the microphone 210 of the mobile object 20 is high, the sound picking-up angle becomes smaller and the sound picking-up distance, within which the microphone 210 can pick up sounds, becomes longer, so that a large value can be adopted as the distance threshold. On the other hand, when the directivity of the microphone 210 of the mobile object 20 is low, the sound picking-up angle becomes larger and the sound picking-up distance becomes shorter, so that a small value can be adopted as the distance threshold. In this way, it is possible to effectively prevent a howling noise from occurring according to the directivity of the microphone 210 of the mobile object 20.

Similarly, when the directivity of the speaker 220 of the mobile object 20 is high, i.e., when the output angle of the speaker 220 is small, the propagation distance of a sound output from the speaker 220 becomes longer, so that a large value can be adopted as the distance threshold. On the other hand, when the directivity of the speaker 220 of the mobile object 20 is low, i.e., when the output angle of the speaker 220 is large, the propagation distance becomes shorter, so that a small value can be adopted as the distance threshold. In this way, it is possible to effectively prevent a howling noise from occurring according to the directivity of the speaker 220 of the mobile object 20.

Further, in the above-described embodiment, it is possible to adopt a value having a positive correlation with the sensitivity of the microphone 210 of the mobile object 20 can be adopted as the distance threshold. Specifically, when the sensitivity of the microphone 210 of the mobile object 20 is high, the sound picking-up distance becomes longer, so that a large value can be adopted as the distance threshold. On the other hand, when the sensitivity of the microphone 210 of the mobile object 20 is low, the sound picking-up distance becomes shorter, so that a small value can be adopted as the distance threshold. In this way, it is possible to effectively prevent a howling noise from occurring according to the sensitivity of the microphone 210 of the mobile object 20.

Further, in the above-described embodiment, it is possible to adopt a value having a positive correlation with the volume of the speaker 220 of the mobile object 20 as the distance threshold. Specifically, when the volume of the speaker 220 of the mobile object 20 is large, the propagation distance becomes longer, so that a large value can be adopted as the distance threshold. On the other hand, when the volume of the speaker 220 of the mobile object 20 is small, the propagation distance becomes shorter, so that a small value can be adopted as the distance threshold. In this way, it is possible to effectively prevent a howling noise from occurring according to the volume of the speaker 220 of the mobile object 20.

Other Embodiment

In an another embodiment, the orientation determination unit 101 further determines whether or not at least one of the directional microphone 110 and the directional speaker 120 of the operation terminal 10 is facing toward the mobile object 20 based on the position of the operation terminal 10, the orientation of the operation terminal 10 (i.e., the direction in which the operation terminal 10 is facing), at least one of the sound picking-up angle of the directional microphone 110 of the operation terminal 10 and the output angle of the directional speaker 120 thereof, and the position of the mobile object 20. In this embodiment, the operation terminal 10 includes a position-and-orientation specifying apparatus similar to the position-and-orientation specifying apparatus 280, and can specify the position and the orientation of the operation terminal 10.

When at least one of the directional microphone 110 and the directional speaker 120 of the operation terminal 10 is facing toward the mobile object 20, the threshold setting unit 102 can set a third threshold as the distance threshold. On the other hand, when neither the directional microphone 110 of the operation terminal 10 nor the directional speaker 120 thereof is facing toward the mobile object 20, the threshold setting unit 102 can set a fourth threshold smaller than the third threshold as the distance threshold. In this way, it is possible to reduce at least one of the volume (i.e., the sensitivity) of the microphone 210 of the mobile object 20 and the volume of the speaker 220 thereof based on the orientations of the directional microphone 110 and the directional speaker 120 of the operation terminal 10.

Further, in another embodiment, the operation terminal 10 may further execute a volume control program and thereby control at least one of the volume (i.e., the sensitivity) of the microphone 110 of the operation terminal 10 and the volume of the speaker 120 thereof.

Further, in another embodiment, the mobile object 20 may execute a volume control program and thereby control at least one of the volume (i.e., the sensitivity) of the microphone 210 of the mobile object 20 and the volume of the speaker 220 thereof.

Further, in another embodiment, an apparatus other than the operation terminal 10 and the mobile object 20 may execute a volume control program and thereby control at least one of the volume (i.e., the sensitivity) of the microphone and the volume of the speaker of the operation terminal 10 and/or the mobile object 20.

Further, although each of the operation terminal 10 and the mobile object 20 includes both a microphone and a speaker in the above-described embodiment, the operation terminal 10 may include a microphone without including a speaker and the mobile object 20 may include a speaker without including a microphone in other embodiments. In this case, it is possible to control at least one of the volume (i.e., the sensitivity) of the microphone 110 of the operation terminal 10 and the volume of the speaker 220 of the mobile object 20. Further, in another embodiment, the operation terminal 10 may include a speaker (without including a microphone) and the mobile object 20 may include a microphone (without including a speaker). In this case, it is possible to control at least one of the volume of the speaker 120 of the operation terminal 10 and the volume (i.e., the sensitivity) of the microphone 210 of the mobile object 20.

In the above-described example, the program includes instructions (or software codes) that, when loaded into a computer, cause the computer to perform one or more of the functions described in the embodiments. The program may be stored in a non-transitory computer readable medium or a tangible storage medium. By way of example, and not a limitation, non-transitory computer readable media or tangible storage media can include a random-access memory (RAM), a read-only memory (ROM), a flash memory, a solid-state drive (SSD) or other types of memory technologies, a CD-ROM, a digital versatile disc (DVD), a Blu-ray disc or other types of optical disc storage, and magnetic cassettes, magnetic tape, magnetic disk storage or other types of magnetic storage devices. The program may be transmitted on a transitory computer readable medium or a communication medium. By way of example, and not a limitation, transitory computer readable media or communication media can include electrical, optical, acoustical, or other forms of propagated signals. Examples of the computer include various types of apparatuses such as a PC (Personal Computer), a server, a CPU, an MPU, an FPGA (Field-Programmable Gate Array), and an ASIC (Application Specific Integrated Circuit).

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A volume control system comprising:
a mobile object comprising at least one of a directional microphone and a directional speaker; and
an operation terminal comprising at least one of a microphone and a speaker, and configured to control the mobile object, wherein
the volume control system is configured to:
determine whether or not at least one of the directional microphone and the directional speaker of the mobile object is facing toward the speaker of the operation terminal based on a position of the mobile object, an orientation of the mobile object, a sound picking-up angle of the directional microphone of the mobile object and an output angle of the directional speaker thereof, and a position of the operation terminal;
set, when at least one of the directional microphone and the directional speaker of the mobile object is facing toward the speaker of the operation terminal, a predetermined threshold as a distance threshold;
determine whether or not a distance between the mobile object and the operation terminal is equal to or shorter than the predetermined threshold based on the position of the mobile object and the position of the operation terminal; and
make, when the distance is equal to or shorter than the predetermined threshold, at least one of the mobile object and the operation terminal reduce at least one of a volume of its microphone and a volume of its speaker.

2. The volume control system according to claim 1, wherein
the predetermined threshold is a first threshold, and
the volume control system is further configured to set, when neither the directional microphone of the mobile object nor the directional speaker thereof is facing toward the speaker of the operation terminal, a second threshold smaller than the first threshold as the distance threshold.

3. The volume control system according to claim 2, wherein the volume control system is further configured to:
determine whether or not at least one of the microphone and the speaker of the operation terminal is facing toward the mobile object based on the position of the operation terminal, an orientation of the operation terminal, a sound picking-up angle of the microphone of the operation terminal and an output angle of the speaker thereof, and the position of the mobile object; and
set, when at least one of the microphone and the speaker of the operation terminal is facing toward the mobile object, a third threshold as the distance threshold.

4. The volume control system according to claim 3, wherein the volume control system is further configured to set, when neither the microphone of the operation terminal nor the speaker thereof is facing toward the mobile object, a fourth threshold smaller than the third threshold as the distance threshold.

5. The volume control system according to claim 1, wherein the distance threshold is a value having a positive correlation with a directivity of the directional microphone and the directional speaker.

6. The volume control system according to claim 1, wherein the distance threshold is a value having a positive correlation with a sensitivity of the directional microphone.

7. The volume control system according to claim 1, wherein the distance threshold is a value having a positive correlation with a volume of the speaker.

8. A volume control method for controlling at least one of a volume of a mobile object and a volume of an operation terminal, the mobile object including at least one of a directional microphone and a directional speaker, the operation terminal including at least one of a microphone and a speaker, and configured to control the mobile object, and the volume control method comprising:
determining, by a computer, whether or not at least one of the directional microphone and the directional speaker of the mobile object is facing toward the speaker of the operation terminal based on a position of the mobile object, an orientation of the mobile object, a sound picking-up angle of the directional microphone of the mobile object and an output angle of the directional speaker thereof, and a position of the operation terminal;
setting, by the computer, when at least one of the directional microphone and the directional speaker of the mobile object is facing toward the speaker of the operation terminal, a predetermined threshold as a distance threshold;
determining, by the computer, whether or not a distance between the mobile object and the operation terminal is equal to or shorter than the predetermined threshold based on the position of the mobile object and the position of the operation terminal; and
making, by the computer, when the distance is equal to or shorter than the predetermined threshold, at least one of the mobile object and the operation terminal reduce at least one of a volume of its microphone and a volume of its speaker.

9. The volume control method according to claim 8, wherein
the predetermined threshold is a first threshold, and
the volume control method further comprises setting, by the computer, when neither the directional microphone of the mobile object nor the directional speaker thereof is facing toward the speaker of the operation terminal, a second threshold smaller than the first threshold as the distance threshold.

10. The volume control method according to claim 9, further comprising:
determining, by the computer, whether or not at least one of the microphone and the speaker of the operation terminal is facing toward the mobile object based on the position of the operation terminal, an orientation of the operation terminal, a sound picking-up angle of the microphone of the operation terminal and an output angle of the speaker thereof, and the position of the mobile object; and
setting, by the computer, when at least one of the microphone and the speaker of the operation terminal is facing toward the mobile object, a third threshold as the distance threshold.

11. The volume control method according to claim 10, further comprising setting, by the computer, when neither the microphone of the operation terminal nor the speaker thereof is facing toward the mobile object, a fourth threshold smaller than the third threshold as the distance threshold.

12. The volume control method according to claim 8, wherein the distance threshold is a value having a positive correlation with a directivity of the microphone and the directional speaker.

13. The volume control method according to claim 8, wherein the distance threshold is a value having a positive correlation with a sensitivity of the microphone.

14. The volume control method according to claim 8, wherein the distance threshold is a value having a positive correlation with a volume of the speaker.

15. A non-transitory computer readable medium storing a volume control program for a computer configured to control at least one of a volume of a mobile object and a volume of an operation terminal, the mobile object including at least one of a directional microphone and a directional speaker, the operation terminal including at least one of a microphone and a speaker, and configured to control the mobile object, and the volume control program being adapted for causing the computer to perform:

- determine, by a computer, whether or not at least one of the directional microphone and the directional speaker of the mobile object is facing toward the speaker of the operation terminal based on a position of the mobile object, an orientation of the mobile object, a sound picking-up angle of the directional microphone of the mobile object and an output angle of the directional speaker thereof, and a position of the operation terminal;
- set, by the computer, when at least one of the directional microphone and the directional speaker of the mobile object is facing toward the speaker of the operation terminal, a predetermined threshold as a distance threshold;
- determine, by the computer, whether or not a distance between the mobile object and the operation terminal is equal to or shorter than the predetermined threshold based on the position of the mobile object and the position of the operation terminal; and
- make, by the computer, when the distance is equal to or shorter than the predetermined threshold, at least one of the mobile object and the operation terminal reduce at least one of a volume of its microphone and a volume of its speaker.

16. The non-transitory computer readable medium according to claim 15, wherein
the predetermined threshold is a first threshold, and
the volume control program further causes the computer to set, when neither the directional microphone of the mobile object nor the directional speaker thereof is facing toward the speaker of the operation terminal, a second threshold smaller than the first threshold as the distance threshold.

17. The non-transitory computer readable medium according to claim 16, wherein the volume control program further causes the computer to:

- determine whether or not at least one of the directional microphone and the speaker of the operation terminal is facing toward the mobile object based on the position of the operation terminal, an orientation of the operation terminal, a sound picking-up angle of the directional microphone of the operation terminal and an output angle of the speaker thereof, and the position of the mobile object; and
- set, when at least one of the microphone and the speaker of the operation terminal is facing toward the mobile object, a third threshold as the distance threshold.

18. The non-transitory computer readable medium according to claim 17, wherein the volume control program further causes the computer to set, when neither the microphone of the operation terminal nor the speaker thereof is facing toward the mobile object, a fourth threshold smaller than the third threshold as the distance threshold.

19. The non-transitory computer readable medium according to claim 15, wherein the distance threshold is a value having a positive correlation with a directivity of the directional microphone and the directional speaker.

20. The non-transitory computer readable medium according to claim 15, wherein the distance threshold is a value having a positive correlation with a sensitivity of the directional microphone.

21. The non-transitory computer readable medium according to claim 15, wherein the distance threshold is a value having a positive correlation with a volume of the speaker.

* * * * *